(12) United States Patent
Miyake et al.

(10) Patent No.: US 7,647,537 B2
(45) Date of Patent: Jan. 12, 2010

(54) PROGRAMMABLE LOGIC DEVICE, INFORMATION PROCESSING DEVICE AND PROGRAMMABLE LOGIC DEVICE CONTROL METHOD

(75) Inventors: Masato Miyake, Yokohama (JP); Kanichi Moroi, Yokohama (JP); Akihiro Mihata, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 375 days.

(21) Appl. No.: 11/089,141

(22) Filed: Mar. 25, 2005

(65) Prior Publication Data

US 2006/0117234 A1    Jun. 1, 2006

(30) Foreign Application Priority Data

Nov. 30, 2004   (JP)   ............... 2004-345293

(51) Int. Cl.
*G01R 31/28* (2006.01)
(52) U.S. Cl. ........................... 714/725; 714/48
(58) Field of Classification Search ............ 365/189.07, 365/189.08; 326/41; 714/746, 725, 751, 714/717, 716, 189.07, 48; 257/473; 382/232; 375/240.27; 370/252, 352
See application file for complete search history.

(56) References Cited

U.S. PATENT DOCUMENTS

| | | | | |
|---|---|---|---|---|
| 5,282,163 A * | 1/1994 | Shibata | ................... | 365/189.08 |
| 5,859,544 A * | 1/1999 | Norman | ....................... | 326/40 |
| 6,255,849 B1 * | 7/2001 | Mohan | ......................... | 326/41 |
| 6,363,019 B1 * | 3/2002 | Erickson et al. | ........ | 365/189.07 |
| 7,143,329 B1 * | 11/2006 | Trimberger et al. | ......... | 714/746 |
| 7,310,757 B2 * | 12/2007 | Ngo et al. | ................... | 714/725 |
| 7,328,377 B1 * | 2/2008 | Lewis et al. | ................... | 714/48 |

FOREIGN PATENT DOCUMENTS

JP     2000-151388     5/2000

* cited by examiner

*Primary Examiner*—David Ton
(74) *Attorney, Agent, or Firm*—Staas & Halsey LLP (57) ABSTRACT

The present invention provides a programmable logic device including a main circuit unit capable of variably building desired user logic, based on configuration data inputted from a storage device, and a configuration data monitor unit for monitoring configuration data stored in the storage device.

20 Claims, 6 Drawing Sheets

PROGRAMMABLE LOGIC DEVICE, INFORMATION PROCESSING DEVICE AND PROGRAMMABLE LOGIC DEVICE CONTROL METHOD

FIELD OF THE INVENTION

The present invention relates to a programmable logic device, an data processing device and the control method of the programmable logic device, and more particularly to a technology effective when stored in a storage device, such as rewritable non-volatile memory or the like and applied to the handling of configuration data or the like referenced at the time of logic building.

DESCRIPTION OF THE RELATED ART

In response to requests of the recent miniaturization of an data processing device in a computer system, a network system or the like and reduction of its development period, a programmable logic device represented by a field programmable gate array (FPGA), a complex programmable logic device (CPLD) and the like has occupied a large ratio in the circuit configuration of the data processing device. Therefore, there is a fear that the failure of the programmable logic device may be fatal to the data processing device in which it is built.

This programmable logic device is used to realize any programmable logic function a user wants by arbitrarily defining (configuring) the internal combination of logic circuit groups and their connections, based on configuration data read from an external rewritable non-volatile memory at the time of power on.

Therefore, by using this programmable logic device, the trial manufacturing of a variety of logic functions at the early development stage, its functional reinforcement/modification after its commercialization and the like, of the data processing device can be easily and rapidly realized simply by rewriting the configuration data. Thus, the reduction of the development period at the early development stage, its functional modifications/reinforcement at an operation site after shipment and the like, of the data processing device can be easily and rapidly realized. As described above, the configuration data determines the logic function of the programmable logic device, and the propriety check of the configuration data is important.

However, conventionally, this propriety of the configuration data was checked only at the time of configuration operation when the programmable logic device reads the configuration data from the non-volatile memory and is developed into a target logic function.

Therefore, if abnormality occurs in the configuration data in the non-volatile memory after the configuration operation, the abnormality could not be detected before subsequent configuration is on operation.

As a result, for example, if unexpected abnormality occurs in the configuration data of the non-volatile memory after the target user logic is built in the programmable logic device by a configuration operation at the time of power on, at the time of subsequent re-start, configuration data to be read from the non-volatile memory is abnormal. Therefore, the re-building of the user logic fails and the programmable logic device cannot be re-started, which is a technical problem.

For example, communication equipment remotely operated and maintained and the like is generally provided with a function to continue the operation by the automatic power switch-on when abnormality occurs. However, if such a programmable logic device with the above-mentioned technical problem is built in, there is a fear that automatic re-start of the operation may be unavailable when abnormality occurs in the configuration data of the non-volatile memory during the operation and that it may lead to the large-scaled failure of the entire communication equipment.

Patent Reference 1 discloses a technology for preventing a failure due to abnormal data to be outputted from a failed FPGA from spreading to the outside, by providing a monitor unit for suppressing data from being outputted to the outside when the FPGA fails. However, the above-mentioned technical problem due to the abnormality of configuration data stored in the non-volatile memory is not recognized.

Patent Reference 1:
Japanese Patent Application No. 2000-151388

SUMMARY OF THE INVENTION

It is an object of the present invention to provide a technology capable of realizing the preventive maintenance due to early detection of abnormality in configuration data to be used in a programmable logic device.

It is another object of the present invention to provide a technology capable of realizing preventive maintenance due to early detection of abnormality in configuration data to be used in a programmable logic device without modifying the configuration of an existing programmable logic device.

It is another object of the present invention to provide a technology capable of improving the operational reliability of a data processing device including a programmable logic device.

It is another object of the present invention to provide a technology capable of improving the operational reliability of a programmable logic device in the case where the execution interval of a configuration operation using configuration data is fairly long.

The first aspect of the present invention provides a programmable logic device, comprising a main circuit unit capable of variably building desired user logic, based on configuration data inputted from a storage device, and a configuration data monitor unit for monitoring the configuration data stored in the storage device.

The second aspect of the present invention provides a programmable logic device, comprising a main circuit unit capable of variably building desired user logic, a configuration data control unit for building the user logic by reading the configuration data from a storage device and inputting it in the main inputting circuit unit, and a configuration data monitor unit provided in a part of the configuration control unit, for monitoring the configuration data stored in the storage device.

The third aspect of the present invention provides a programmable logic device, comprising a main circuitry capable of variably building desired user logic, based on configuration data inputted from a storage device, and a configuration data monitor unit which constitutes a part of the user logic, for monitoring the configuration data stored in the storage device.

The fourth aspect of the present invention provides a data processing device, comprising a programmable logic device capable of variably building desired user logic, based on configuration data read from a storage device, and a configuration data monitor device, inserted between the storage device and the programmable logic device, for monitoring the configuration data stored in the storage device.

The fifth aspect of the present invention provides a control method of a programmable logic device, capable of variably building desired user logic, based on configuration data read from a storage device. The control method comprises a first step of building user logic, based on configuration data read from the storage device, and a second step of reading the configuration data from the storage device and checking whether there is an error in the configuration data except when executing the first step.

The sixth aspect of the present invention provides a configuration data monitor device, provided between programmable logic device capable of variably building desired user logic, based on configuration data and a storage device storing the configuration data, comprising:

a configuration data monitor unit, for monitoring the configuration data stored in the storage device.

According to the present invention, for example, after executing a configuration operation to build user logic in a programmable logic device, using configuration data read from a storage device, such as non-volatile memory or the like, the configuration data in the non-volatile memory is regularly or irregularly read and monitored. If there is an error in this configuration or in the non-volatile memory, the error is reported to the outside.

Thus, a state where the configuration operation of a programmable logic device cannot be performed due to the incorrect configuration data of the non-volatile memory can be detected at the early stage. Therefore, at an early stage before a subsequent configuration operation is performed, preventive maintenance, such as the rewriting of correct configuration data into non-volatile memory, the replacement of non-volatile memory and the like can be realized, and accordingly, the maintenability and reliability of a programmable logic device and a data processing device with the programmable logic device can be improved.

DESCRIPTION OF THE PREFERRED EMBODIMENTS

The preferred embodiments of the present invention are described in detail below with reference to the drawings. In the following description, the same reference numerals among different drawings represent the same components.

Figure 1:
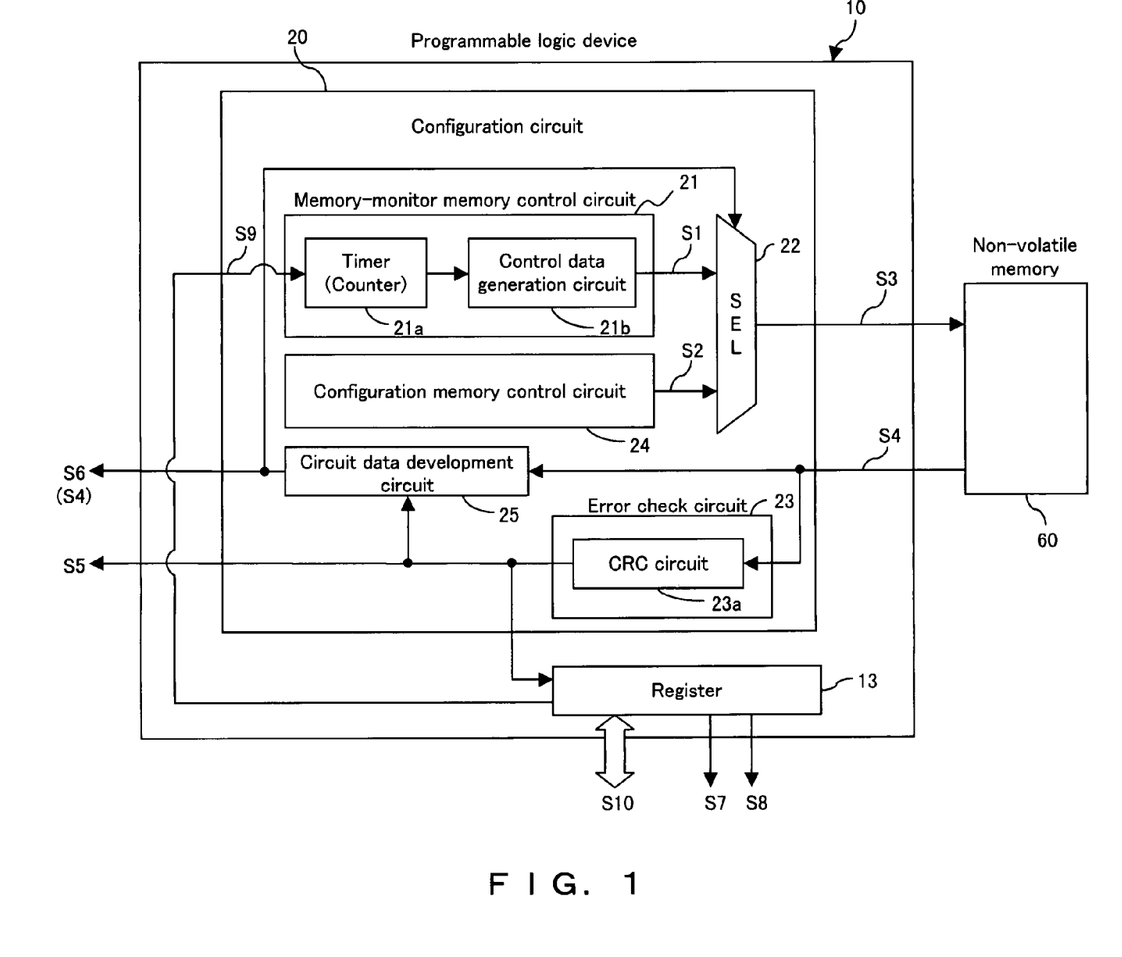
FIG. 1 shows an example of the basic internal configuration of a programmable logic device for implementing the control method of a programmable logic device, which is one aspect of the present invention.
Figure 2:
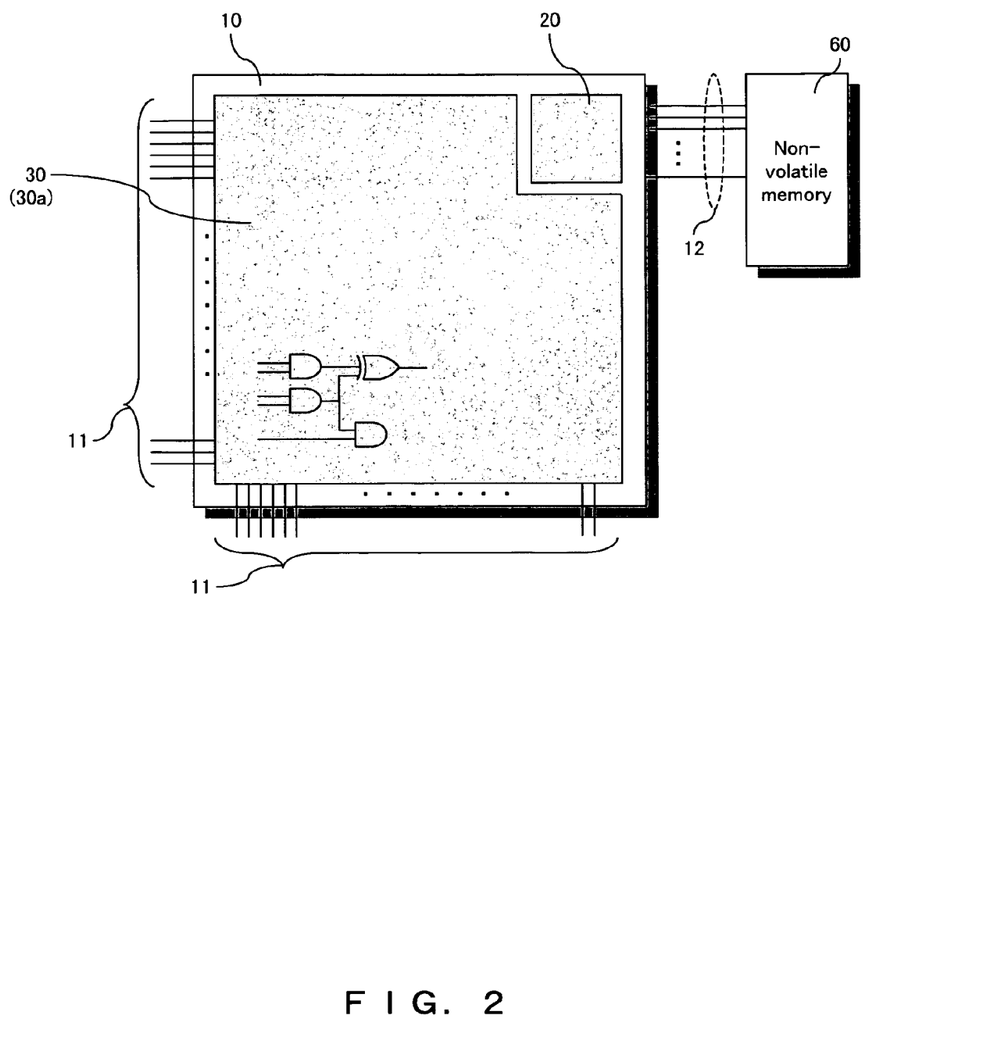
FIG. 2 shows an example of the entire configuration.
Figure 3:
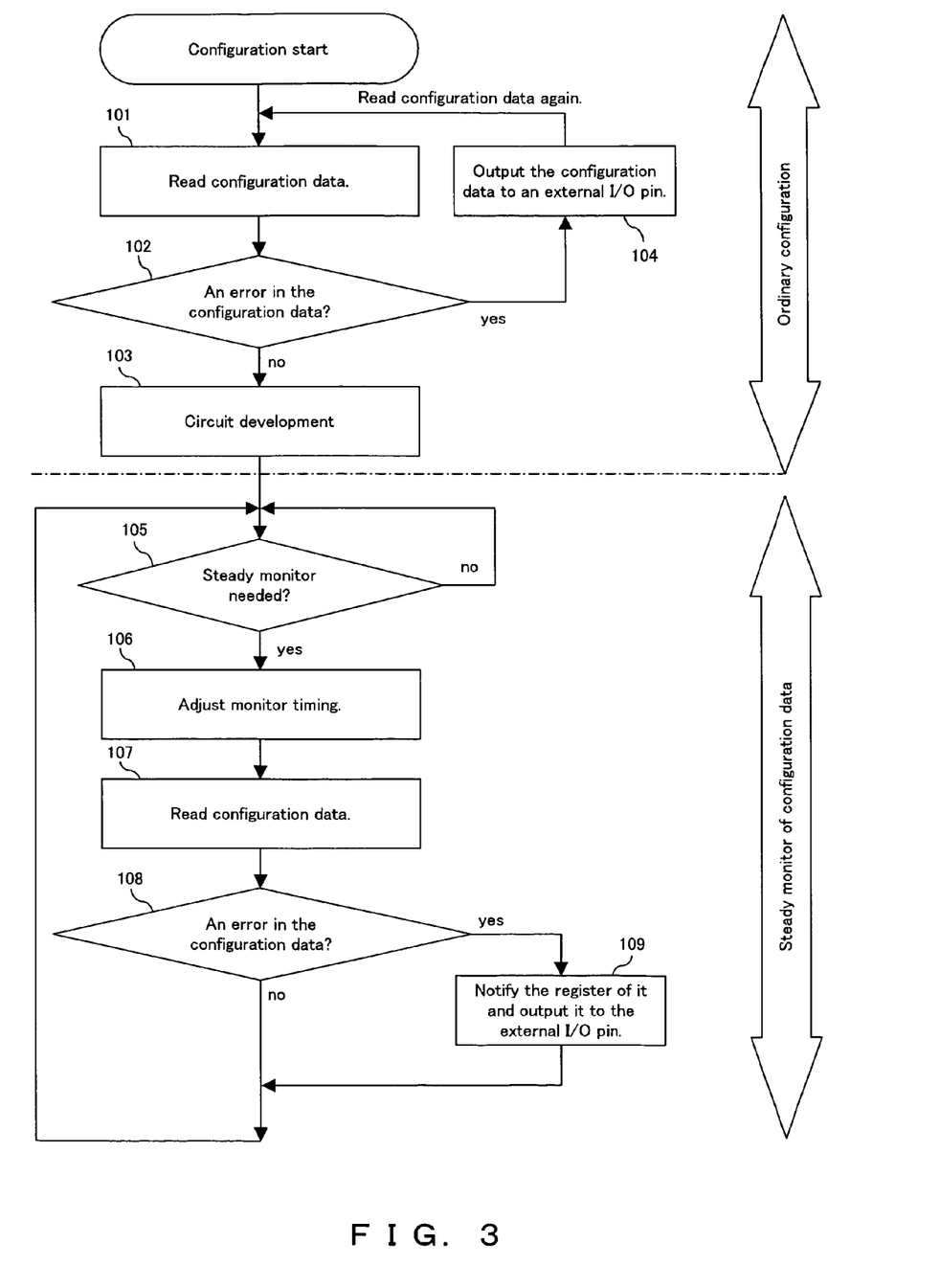
FIG. 3 is a flow chart showing an example of its function.

FIG. 1 shows an example of the basic internal configuration of a programmable logic device for implementing the control method of a programmable logic device, which is one aspect of the present invention. FIG. 2 shows an example of the entire configuration. FIG. 3 is a flowchart showing an example of its function.

As exemplified in FIGS. 1 and 2, the programmable logic device 10 in this preferred embodiment 1 comprises a configuration circuit 20, a main circuit unit 30, a user input/output pin 11, a configuration input/output pin 12 and a register 13.

The main circuit unit 30 is provided with a function to realize desired programmable user logic 30a by defining the combination of logic circuit groups configured by hardware, the connection among the logic circuit groups or the like, based on configuration data externally set.

The user input/output pin 11 is used for the user logic 30a built in the main circuit unit 30 to input/output data from/to the outside. The configuration input/output pin 12 is used for the configuration circuit 20 to access an external non-volatile memory 60.

The register 13 is used to read data indicating the internal state of a programmable logic device from the outside and to externally set data for controlling the operation of the programmable logic device. The register 13 is also provided with a function to output an interruption signal S7 for cutting in on the central processing unit (CPU) of an external higher-order system, which is not shown in FIGS. 1 nor 2, and an LED indication signal S8 when a configuration data error signal S5 is inputted from an error check circuit 23. The LED indication signal S8 lights a light emitting diode (LED) externally set, which is not shown in FIGS. 1 nor 2 when detecting the configuration data error signal S5.

The configuration circuit 20 performs a configuration operation to build desired user logic 30a in the main circuit unit 30, based on configuration data S4 read from an external non-volatile memory 60 via the configuration input/output pin 12.

The non-volatile memory 60 is composed of, for example, batch deletion type EEPROM and the like, and stores erasable configuration data S4. Therefore, any programmable user logic 30a corresponding to the configuration data S4 can be built in the main circuit unit 30 by reading this configuration data S4 and performing a configuration operation by the configuration circuit 20, after rewriting the configuration data S4 stores in the non-volatile memory 60.

If the power of the programmable logic device is switched off, the user logic 30a built in the main circuit unit 30 is lost. Therefore, in order to re-build this user logic 30a, configuration data S4 must be read again from the non-volatile memory 60 and a configuration operation must be performed again.

The configuration circuit 20 for executing a configuration operation comprises a configuration memory control circuit 24, an error check circuit 23 and a circuit data development circuit 25.

In the case of this preferred embodiment 1, the configuration circuit 20 further comprises a memory-monitor memory control circuit 21 (configuration data monitor unit) and a selector 22.

The selector 22 switches in such a way that either memory-monitor memory-control circuit 21 or the configuration memory control circuit 24 can be connected to the non-volatile memory 60.

The configuration memory control circuit 24 reads configuration data S4 from the non-volatile memory 60 by outputting a configuration-time memory control signal S2, such as an access control signal, an address signal and the like, to the non-volatile memory 60 as a memory control signal S3 (reading address data) when executing an ordinary configuration operation.

The circuit data development circuit 25 develops configuration data S4 read from the non-volatile memory 60 into circuit data for building target user logic 30a in the main circuit unit 30 and stores it to the main circuit unit 30. After the completion of the configuration, the circuit data development circuit 25 outputs a configuration completion signal S6 to the main circuit unit 30 and the selector 22.

The selector 22 is usually set to select configuration-time memory control signal S2, and selects a memory monitor-time memory control signal S1 using the input of configuration completion signal S6 from the circuit data development circuit 25 as a trigger.

The error check circuit 23 comprises, for example, a CRC circuit 23a. The error check circuit 23 verifies the propriety (check the existence /non-existence of an error) of configuration data S4 read from the non-volatile memory 60 by this CRC circuit 23a, and outputs the result of the verification to the register 13 and the main circuit unit 30 as configuration data error signal S5.

The memory-monitor memory-control circuit 21 outputs memory monitor-time memory control signal S1, such as an access control signal, an address signal and the like, to the non-volatile memory 60 as memory control signal S3 when monitoring configuration data S4 stored in the non-volatile memory 60. Then, the error check circuit 23 reads configuration data S4 from the non-volatile memory 60.

This memory-monitor memory-control circuit 21 comprises a timer 21a and a control data generation circuit 21b. The timer 21a starts the control data generation circuit 21b in timing or a cycle based on setting data externally preset in the register 13. The control data generation circuit 21b generates memory monitor-time memory control signal S1, such as an access control signal, an address signal and the like, for the non-volatile memory 60, in timing it is started by the timer 21a.

An example of the operation of the programmable logic device 10 in this preferred embodiment 1 is described below with reference to the flowchart shown in FIG. 3.

Firstly, in the non-volatile memory 60, configuration data S4 for realizing target user logic 30a in the main circuit unit 30 is written in advance from an external data processing system.

In the register 13, data about whether to conduct the steady monitor of the non-volatile memory 60 and data about the operation cycle of the timer 21a in the case where steady monitor is conducted and the like is set by a CPU bus signal S10 from the external system.

If in this state, the programmable logic device 10 is switched on, the configuration memory control circuit 24 in the configuration circuit 20 provided in the programmable logic device 10 generates configuration-time memory control signal S2, and this configuration-time memory control signal S2 is inputted to the non-volatile memory 60 as memory control signal S3 via the selector 22. Thus, the circuit data development circuit 25 and error check circuit 23 read configuration data S4 stored in the non-volatile memory 60 (step 101).

In this case, in parallel with the development into circuit data of configuration data S4 in the circuit data development circuit 25 (step 103), in the error check circuit 23, the cyclic redundancy check (CRC) of the configuration data S4 read from the non-volatile memory is conducted (step 102). If an error is detected by this CRC, configuration data error signal S5 is outputted to the circuit data development circuit 25, main circuit unit 30 and register 13. From the register 13, interruption signal S7 and LED indication signal S8 are outputted to the external system via the user input/output pin 11 (step 104) to notify the outside of error occurrence.

If an error occurs, configuration data S4 is read from the non-volatile memory 60 again.

If the development into circuit data and the input to the main circuit unit 30 of configuration data S4 is completed (step 103), configuration completion signal S6 is outputted to the main circuit unit 30 and selector 22, and in response to the configuration data S4, the user logic 30a built in the main circuit unit 30 is started and operated. Then, if the user logic 30a inputs/outputs data, for example, using the user input/output pin 11, a prescribed data processing is started.

In this case, conventionally, once the user logic 30a built in the main circuit unit 30 is started, no access to the non-volatile memory 60 occurs from the programmable logic device 10 until a subsequent configuration operation is needed.

However, in the case of this preferred embodiment, the configuration data S4 stored in the non-volatile memory 60 is monitored as follows.

Specifically, when the configuration completion signal S6 is inputted to the selector 22, the selector 22 switches in such a way as to select the memory monitor-time memory control signal S1 of the memory-monitor memory-control circuit 21 as memory control signal S3, using the completion of the configuration operation in steps 101 through 103 as a trigger.

Then, the memory-monitor memory control circuit 21 determines whether to monitor the non-volatile memory 60, referring to setting data for the register 13 from the external system (step 105).

If the non-volatile memory 60 is monitored, in the memory-monitor memory control circuit 21, the timer 21a starts the control data generation circuit 21b in a cycle set by a timer setting signal S9 inputted from the register 13 (step 106) and the control data generation circuit 21b inputs memory monitor-time memory control signal S1 to the non-volatile memory 60 as memory control signal S3, thereby the error check circuit 23 reads configuration data S4 (step 107). Then, the error check circuit 23 monitors the propriety of the configuration data S4 stored in the non-volatile memory 60 by conducting the CRC of the configuration data S4 read from the non-volatile memory 60 (step 108).

If an error is detected from the configuration data S4 read from the non-volatile memory 60, interruption signal S7 is outputted from the register 13 to a higher-order CPU to notify the CPU of the error and also to notify the system manager of the occurrence of abnormality in the configuration data S4 stored in the non-volatile memory 60 by lighting an LED, which is not shown in FIGS. 1 and 2 (step 109).

Upon receipt of this error notice, the system manager conducts the maintenance check and replacement of the non-volatile memory 60, and also in preparation of the execution of configuration operation after that, conducts preventive maintenance for overwriting normal configuration data S4 on the non-volatile memory 60 and correcting the error of the configuration data S4 in advance.

As described above, in this preferred embodiment 1, after the completion of an ordinary configuration operation to build desired user logic 30a in the main circuit unit 30, the non-volatile memory 60 is irregularly accessed by the memory-monitor memory control circuit 21 provided in the configuration circuit 20 by developing configuration data S4 read from the non-volatile memory 60 into circuit data and inputting the data in the main circuit unit 30. Then, the error check circuit 23 reads the configuration data S4 stored in the non-volatile memory 60 to conduct error check.

Thus, the occurrence of abnormality in the configuration data S4 that is stored and left alone in the non-volatile memory 60 until a subsequent configuration operation is performed after the first configuration operation can be detected at an early stage, and accordingly, preventive maintenance can be realized by error recovery, such as the replacement of the non-volatile memory 60, the overwriting of normal configuration data S4 or the like.

The preventive maintenance of this non-volatile memory 60 and configuration data S4 stored in the non-volatile memory 60 can be conducted without affecting the operation of the user logic 30a of the programmable logic device 10 being normally operating and without suspending the operation of the user logic 30a.

For example, if user logic 30a built in the main circuit unit 30 is continuously operated and used for a long time, the non-volatile memory 60 storing configuration data S4 is left alone for a long time until a subsequent configuration operation is performed after the first configuration operation, and there is high probability that an error may occur in configuration data S4 stored in the non-volatile memory 60. If the programmable logic device 10 performs a configuration operation again in a state where there is an error in the configuration data S4 in the non-volatile memory 60, there is fear that it may lead to a large-scaled failure. For example, the configuration operation using the failed configuration data S4 fails, the programmable logic device 10 downs and the entire system in which the failed programmable logic device 10 is built downs.

However, in the case of this preferred embodiment 1, even if a period until a subsequent configuration operation is performed after the first configuration operation is long like this, the preventive maintenance of configuration data S4 stored in the non-volatile memory 60 by regular check is conducted while the non-volatile memory 60 is left alone. Therefore, the large-scaled failure due to the down of the programmable logic device 10 can be prevented.

Especially, recently, the programmable logic device 10 has been widely popular in all kinds of data processing systems. In a system presuming the continuous operation in high reliability for a long time, such as a communication system, the execution interval of a configuration operation, that is, the left-alone period of the non-volatile memory 60 storing configuration data S4 tends to prolong. The configuration operation must be surely performed if required. Therefore, the technology of the preferred embodiment of the present invention, for performing the error check of configuration data S4 stored in the non-volatile memory 60 during a long left-alone period except configuration operation time is very effective in preventive maintenance.

Figure 4:
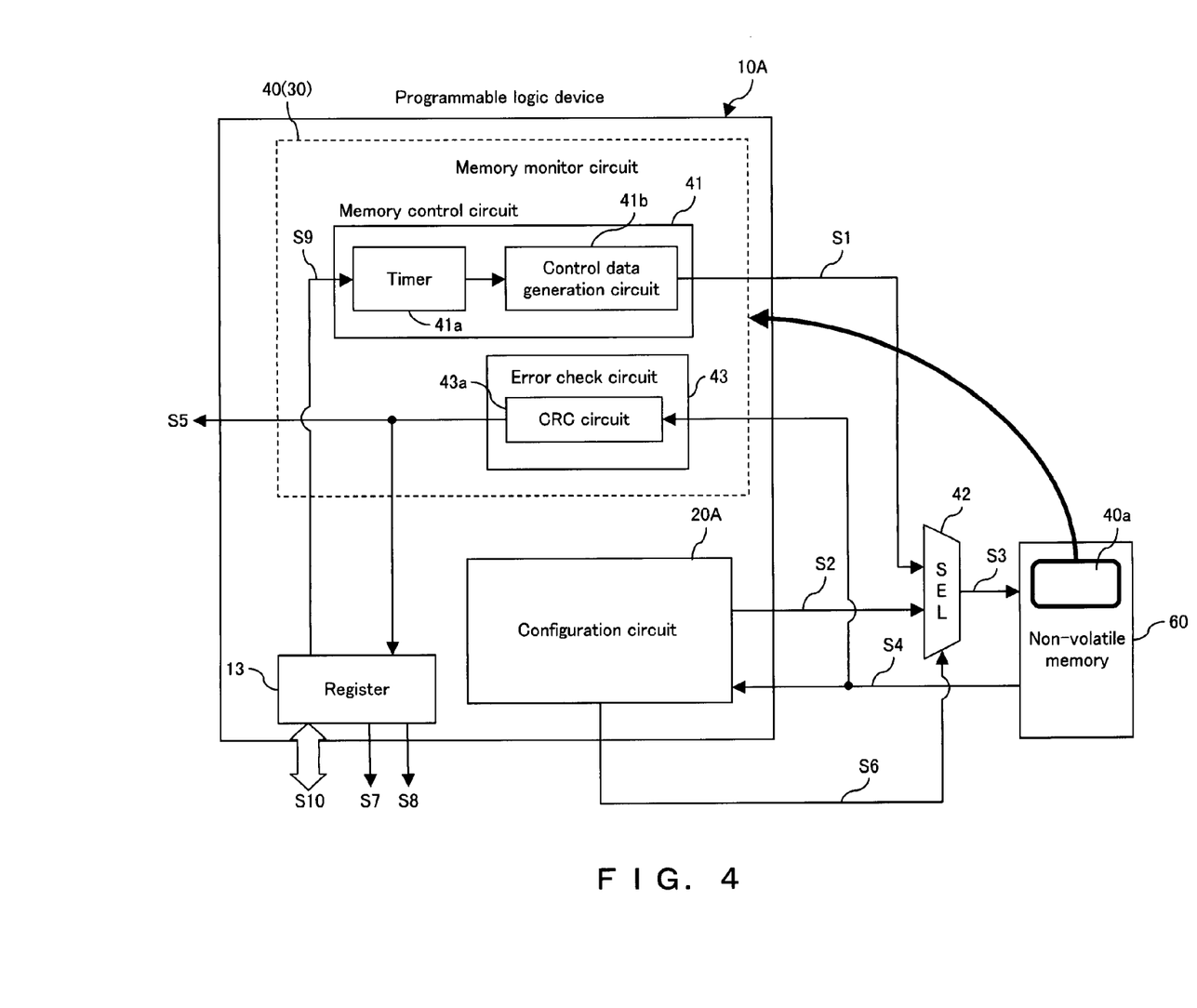
FIG. 4 is a block diagram showing an example of the configuration of a programmable logic device for implementing the control method of a programmable logic device, which is another aspect of the present invention.
Figure 5:
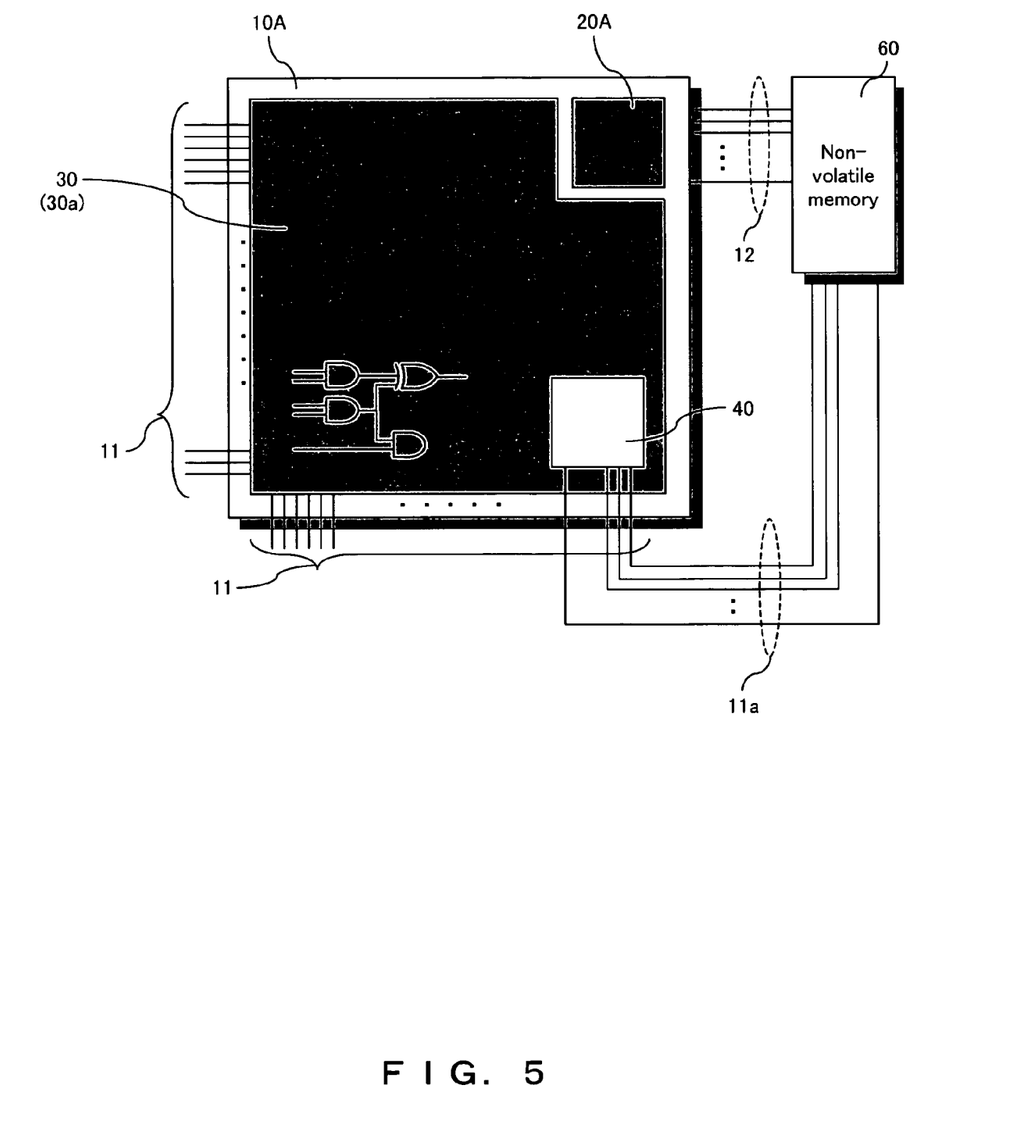
FIG. 5 shows an example of the entire configuration.

FIG. 4 is a block diagram showing an example of the configuration of a programmable logic device for implementing the control method of the programmable logic device, which is another aspect of the present invention. FIG. 5 shows an example of the entire configuration.

In this preferred embodiment 2 of the present invention, a case where a memory monitor circuit (configuration data monitor logic) 40 with a function to monitor configuration data S4 stored in the non-volatile memory 60 is provided in the main circuit unit 30 of the programmable logic device 10 as a part of programmable user logic 30a built in the main circuit unit 30, is described.

Specifically, the programmable logic device 10A in the preferred embodiment 2 of the present invention comprises the main circuit unit 30 for variably building user logic 30a by a configuration operation and a configuration circuit 20A for performing this configuration operation.

For this configuration circuit 20A, a conventional circuit without the respective functions of the memory-monitor memory control circuit 21, selector 22 and the like, exemplified in the above mentioned preferred embodiment 1 can be used without modifications. Specifically, in this preferred embodiment 2, for the programmable logic device 10A as hardware, a conventional circuit can be used without modifications.

The memory monitor circuit 40 provided in the main circuit unit 30 as a part of user logic 30a comprises a memory control circuit 41, a selector 42 and an error check circuit 43.

The memory control circuit 41 comprises the timer 41a and the control data generation circuit 41b. The error check circuit 43 comprises a CRC circuit 43a.

The memory control circuit 41, selector 42 and error check circuit 43 are configured to perform operations equivalent to the memory-monitor memory control circuit 21, selector 22 and error check circuit 23, respectively. Therefore, the respective descriptions of the memory control circuit 41, selector 42 and error check circuit 43 are omitted here.

The entire programmable memory monitor circuit 40 can be built as a part of the user logic 30a of the main circuit unit 30 by the configuration circuit 20A reading memory monitor circuit configuration data 40a stored in the non-volatile memory 60 as configuration data S4.

In the example shown in FIG. 5, an access to the non-volatile memory 60 of the memory monitor circuit 40 is made using a user input/output pin 11a as a part of the user input/output pin 11.

In the case of this preferred embodiment 2, the memory monitor circuit configuration data 40a (configuration data S4) stored in the non-volatile memory 60 is also the monitor target of the memory monitor circuit 40.

An example of the operation of this preferred embodiment 2 is described below. Firstly, in the first configuration operation of the programmable logic device 10A, configuration-time memory control signal S2 (reading address) outputted from the configuration circuit 20A is selected by the selector 42. Then, the configuration circuit 20A reads the configuration data S4 including the memory monitor circuit configuration data 40a by inputting this configuration-time memory control signal S2 to the non-volatile memory 60, and user logic 30a including the memory monitor circuit 40 is built in the main circuit unit 30 by developing the configuration data S4 into circuit data and inputting it to the main circuit unit 30.

After this configuration operation is completed, the selector 42 is made ready to select the memory monitor-time memory control signal S1 of the memory monitor circuit 40 as memory control signal S3 by configuration completion signal S6 outputted from the configuration circuit 20A to the selector 42.

In the main circuit unit 30, the user logic 30a is started and the memory monitor circuit 40 as its part also starts.

Specifically, the memory control circuit 41 and error check circuit 43 of the memory monitor circuit 40 regularly reads configuration data S4 including the memory monitor circuit configuration data 40a from the non-volatile memory 60 in parallel with the operation of the other functions of the user logic 30a and checks whether there is an error, by performing the processes in steps 105 through 109 in the flowchart shown in FIG. 3.

In the case of this preferred embodiment 2, when an error in the non-volatile memory 60 is notified, a user conducts the maintenance of the non-volatile memory 60 after suspending the function of the memory control circuit 41 via the register 13 and preventing the occurrence of an access to the non-volatile memory 60 of the memory monitor circuit 40, Thus, the user can carry out maintenance work without suspending the operation of the logic functions except the memory monitor circuit 40 of the user logic 30a.

Thus, in the case of this preferred embodiment 2 too, the same effect as the above-mentioned preferred embodiment 1 can be obtained.

Furthermore, in the case of this preferred embodiment 2, the memory monitor circuit 40 can be realized as a part of user logic 30a built in the main circuit unit 30 of the programmable logic device 10A, using the hardware of an existing programmable logic device 10A without any modification. Therefore, no special hardware circuit is needed, and the preventive maintenance of configuration data S4 stored in the non-volatile memory 60 can be realized at a low cost.

Figure 6:
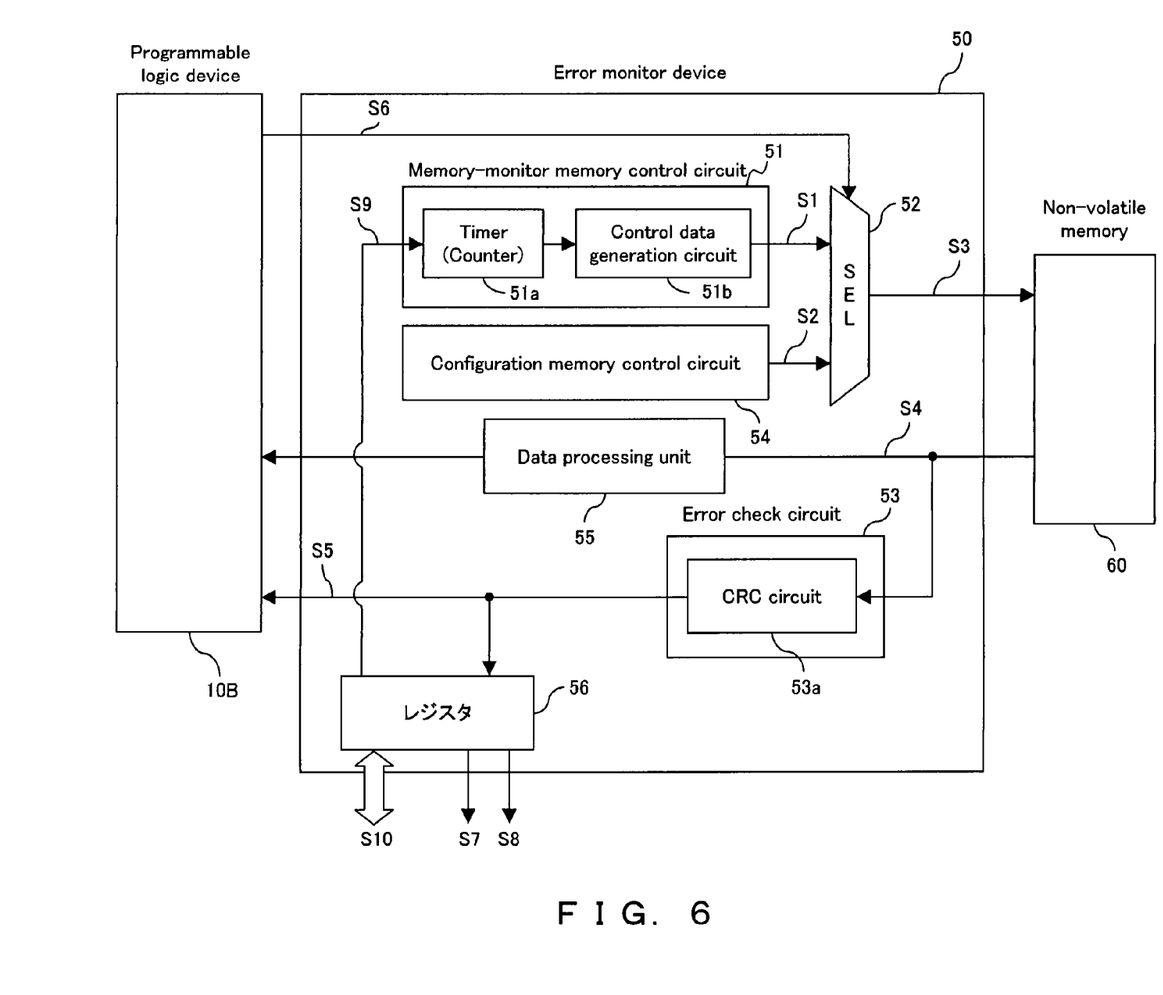
FIG. 6 is a block diagram showing an example of the configuration of a data processing device for implementing the control method of a programmable logic device, which is another aspect of the present invention.

FIG. 6 is a block diagram showing an example of the configuration of the data processing device for implementing the control method of a programmable logic device, which is another aspect of the present invention.

In this preferred embodiment 3, an error monitor device (configuration data monitor device) 50 is disposed between a programmable logic device 10B and the non-volatile memory 60 storing configuration data used by this programmable logic device 10B.

As described above, the data processing device in this preferred embodiment 3 comprises a programmable logic device 10B, the non-volatile memory 60 and an error monitor device 50.

This error monitor device 50 performs a configuration operation to build user logic in the main circuit unit, which is not shown in FIG. 6, of the programmable logic device 10B, by reading configuration data S4 stored in the non-volatile memory 60 and developing the configuration data S4 into circuit data. Furthermore, the error monitor device 50 monitors configuration data stored in the non-volatile memory 60.

The error monitor device 50 comprises a memory-monitor memory control circuit 51, a selector 52, an error check circuit 53, a configuration memory control circuit 54, a data processing unit 55 and a register 56.

The memory-monitor memory control circuit 51, selector 52, error check circuit 53, configuration memory control circuit 54 and register 56 which constitute this error monitor device 50 are provided with functions equivalent to the memory-monitor memory control circuit 21, selector 22, error check circuit 23, configuration memory control circuit 24, and register 13, respectively, in the above-mentioned preferred embodiment 1. Therefore, their descriptions are omitted here.

Although the data processing unit 55 is provided with a function equivalent to the above-mentioned circuit data development circuit 25, configuration completion signal S6 for controlling the selection operation of the selector 52 is obtained from the programmable logic device 10B side.

An example of the function of the data processing device in this preferred embodiment 3 is described below.

Firstly, at the time of ordinary configuration operation, in the selector 52, configuration-time memory control signal S2 outputted from the configuration memory control circuit 54 is selected as memory control signal S3. By inputting this memory control signal S3 to the non-volatile memory 60 as a reading address signal, the data processing unit 55 and error check circuit 53 read configuration data S4 stored in the non-volatile memory 60, and by developing the configuration data S4 into circuit data and inputting it to the programmable logic device 10B, user logic is built in the main circuit unit of the programmable logic device 10B.

If the configuration operation of this user logic is completed, configuration completion signal S6 is outputted from the programmable logic device 10B to the selector 52, and memory monitor-time memory control signal S1 is selected as memory control signal 3.

After this configuration operation is completed, the timer 51a of the memory-monitor memory control circuit 51 starts a control data generation circuit 51b in a cycle set in the register 56. The started control data generation circuit 51b outputs memory monitor-time memory control signal S1. This memory monitor-time memory control signal S1 is inputted to the non-volatile memory 60 via the selector 52 as memory control signal S3. Then, the error check circuit 53 reads configuration data S4 stored in the non-volatile memory 60 to check whether there is an error. The result of this error check is notified to the CPU of the higher-order system and the system manager via the register 56.

If in the error check circuit 53, an error is detected in configuration data S4, in preparation for a subsequent configuration operation, preventive maintenance, such as the replacement of the non-volatile memory 60, the writing of configuration data S4 in the non-volatile memory 60, the overwriting of normal data on configuration data S4 stored in the non-volatile memory 60 or the like is conducted.

As described above, in this preferred embodiment 3, the propriety of configuration data S4 stored in the non-volatile memory 60 can also always be maintained by conducting the error check of configuration data S4 stored in the non-volatile memory 60 from time to time except at the execution time of a configuration operation.

Accordingly, a failure in the configuration operation of the programmable logic device 10B due to the failure of the non-volatile memory 60, the error of configuration data S4 stored in the non-volatile memory 60 or the like can be surely prevented.

As a result, the major failure of the data processing device in which the programmable logic device 10B is built can be surely prevented.

As described above, according to each preferred embodiment of the present invention, in the programmable logic device for reading configuration data stored in the non-volatile memory 60 and building user logic, after the completion of the execution of a configuration operation, the configuration data S4 of the non-volatile memory 60 can also be regularly accessed and its error can also be checked. Therefore, abnormality in configuration data stored in the non-volatile memory 60 can be detected prior to a future new configuration operation.

As a result, the unavailable state of the new configuration operation of the programmable logic device, due to the failure of configuration data stored in the non-volatile memory 60 can be detected at an early stage, which greatly contributes to the improvement of the reliability and maintenability of a programmable logic device and a data processing device including it.

The present invention is not limited to the above-mention preferred embodiments. Its variations and modifications can be possible as long as the subject matter is not deviated.

For example, although in the above-mentioned preferred embodiments, the non-volatile memory 60 is disposed outside the programmable logic device 10, the non-volatile memory 60 can also be incorporated into the programmable logic device 10.

According to the present invention, preventive maintenance can be realized by the early detection of abnormality in configuration data used in a programmable logic device.

Preventive maintenance can also be realized by the early detection of abnormality in configuration data used in a programmable logic device without modifying the configuration of an existing programmable logic device.

The reliability of the operation of a data processing device including a programmable logic device can also be improved.

The reliability of the operation of a programmable logic device in the case where the execution interval of a configuration operation using configuration data is fairly long can also be improved.

What is claimed is:

1. A programmable logic device, comprising:
a main circuit unit capable of variably building desired user logic, based on configuration data inputted from a storage device; and
a configuration data monitor unit for monitoring the configuration data stored in the storage device, wherein an error in the configuration data is checked one of regularly and irregularly after a configuration operation is executed to build user logic in the programmable logic device and configuration data monitor logic reads the configuration data from the storage device in a timing other than when building the user logic.

2. A programmable logic device, comprising:
a main circuit unit capable of variably building desired user logic, based on configuration data inputted from a storage device; and
a configuration data monitor unit for monitoring the configuration data stored in the storage device, and wherein said configuration data monitor unit comprising:
a reading control unit for reading the configuration data from the storage device;
a reading trigger control unit for providing the reading control unit with a trigger for reading the configuration data from the storage device except at the building time of the user logic in the main circuit unit;
an error check unit for checking whether there is an error in the configuration data read from the storage device.

3. A programmable logic device, comprising:
a main circuit unit capable of variably building desired user logic, based on configuration data;
a configuration data control unit for building the user logic by reading the configuration data from a storage device and inputting the data to the main circuit unit; and
a configuration data monitor unit, provided in a part of the configuration data control unit, for monitoring the configuration data stored in the storage device, wherein an error in the configuration data is checked one of regularly and irregularly after a configuration operation is executed to build user logic in the programmable logic device and configuration data monitor logic reads the configuration data from the storage device in a timing other than when building the user logic.

4. The programmable logic device according to claim 3, further comprising
an external interface for externally setting data for controlling an operation of the configuration data monitor unit and outputting resulted data of monitor by the configuration data monitor unit.

5. A programmable logic device, comprising:
a main circuit unit capable of variably building desired user logic, based on configuration data;
a configuration data control unit for building the user logic by reading the configuration data from a storage device and inputting the data to the main circuit unit; and
a configuration data monitor unit, provided in a part of the configuration data control unit, for monitoring the configuration data stored in the storage device, and wherein said configuration control unit comprising:
a first reading control unit for reading the configuration data from the storage device when building the user logic; and
an error check unit for checking whether there is an error in the configuration data read from the storage device, and
said configuration data monitor unit comprises
a second reading control unit for reading the configuration data from the storage device; and
a reading trigger control unit for providing the second reading control unit with a trigger for reading the configuration data from the storage device except at the building time of the user logic; and
an error check unit for checking whether there is an error in the configuration data read from the storage device.

6. A programmable logic device, comprising:
a main circuit unit capable of variably building desired user logic, based on configuration data; and
a configuration data control unit for building the user logic by reading the configuration data from a storage device and inputting the data to the main circuit unit;
said configuration data control unit comprises
a configuration memory control circuit for reading the configuration data from the storage device when building the user logic;
a memory-monitor memory control circuit for reading the configuration data from the storage device except at the building time of the user logic;
a selector for connecting either the configuration memory control circuit or the memory-monitor memory control circuit to the storage device; and
an error check unit for checking whether there is an error in the configuration data read from the storage device by either the configuration memory control circuit or the memory-monitor memory control circuit to the storage device.

7. The programmable logic device according to claim 6, wherein said memory-monitor memory control circuit comprises
a control data generation circuit for generating data for accessing the storage device; and
a timer for providing the control data generation circuit with a trigger for accessing the storage device.

8. The programmable logic device according to claim 6, further comprising
an external interface for externally setting data for controlling an operation of the configuration data monitor unit and outputting resulted data of monitor by the configuration data monitor unit.

9. A programmable logic device, comprising:
a main circuit unit capable of variably building desired user logic, based on configuration data read from a storage device; and
a configuration data monitor logic which constitutes a part of the user logic, for monitoring the configuration data stored in the storage device, wherein an error in the configuration data is checked one of regularly and irregularly after a configuration operation is executed to build user logic in the programmable logic device and the configuration data monitor logic reads the configuration data from the storage device in a timing other than when building the user logic.

10. The programmable logic device according to claim 9, further comprising an external interface for externally setting data for controlling an operation of the configuration data monitor unit and outputting resulted data of monitor by the configuration data monitor unit.

11. A programmable logic device, comprising:
a main circuit unit capable of variably building desired user logic, based on configuration data read from a storage device; and
a configuration data monitor logic which constitutes a part of the user logic, for monitoring the configuration data stored in the storage device, and wherein said configuration data monitor logic comprising:
    a function to read the configuration data from the storage device in timing other than when building the user logic; and
    a function to check whether there is an error in the configuration data.

12. A data processing device, comprising:
a programmable logic device capable of variably building desired user logic, based on configuration data read from a storage device; and
a configuration data monitor device, provided between the storage device and the programmable logic device, for monitoring the configuration data stored in the storage device, wherein an error in the configuration data is checked one of regularly and irregularly after a configuration operation is executed to build user logic in the programmable logic device and configuration data monitor logic reads the configuration data from the storage device in a timing other than when building the user logic.

13. A data processing device, comprising:
a programmable logic device capable of variably building desired user logic, based on configuration data read from a storage device; and
a configuration data monitor device, provided between the storage device and the programmable logic device, for monitoring the configuration data stored in the storage device, and wherein said configuration data monitor device comprising:
    a reading control unit for reading the configuration data from the storage device;
    a reading trigger control unit for providing the reading control unit with a trigger for reading the configuration data from the storage device except at the building time of the user logic; and
    an error check unit for checking whether there is an error in the configuration data read from the storage device.

14. A configuration data monitor device, provided between programmable logic device capable of variably building desired user logic, based on configuration data and a storage device storing the configuration data, comprising:
a configuration data monitor unit, for monitoring the configuration data stored in the storage device, wherein an error in the configuration data is checked one of regularly and irregularly after a configuration operation is executed to build user logic in the programmable logic device and configuration data monitor logic reads the configuration data from the storage device in a timing other than when building the user logic.

15. A configuration data monitor device, provided between programmable logic device capable of variably building desired user logic, based on configuration data and a storage device storing the configuration data, comprising:
a configuration data monitor unit, for monitoring the configuration data stored in the storage device, and wherein said configuration data monitor unit comprising:
    a reading control unit for reading the configuration data from the storage device;
    a reading trigger control unit for providing the reading control unit with a trigger for reading the configuration data from the storage device except when building the user logic; and
    an error check unit for checking whether there is an error in the configuration data read from the storage device.

16. A control method of a programmable logic device capable of variably building desired user logic, based on configuration data read from a storage device, comprising:
a first step of building user logic, based on configuration data read from the storage device; and
a second step of reading the configuration data from the storage device except at the execution time of the first step and checking whether there is an error in the configuration data.

17. The control method of a programmable logic device according to claim 16, wherein
said second step is regularly or irregularly executed by a timer function.

18. The control method of a programmable logic device according to claim 16, wherein
said second step is executed by a configuration data monitor unit provided in a configuration data control unit, provided in a part of the programmable logic device, for inputting the configuration data read from the storage device to said main circuit unit and building the user logic.

19. The control method of a programmable logic device according to claim 16, wherein
said second step is executed by the configuration data monitor logic constituting a part of the user logic.

20. The control method of a programmable logic device according to claim 16, wherein
said second step is executed by a configuration data monitor device provided between the storage device and the programmable logic device.

* * * * *